United States Patent
Lau

(10) Patent No.: US 11,186,906 B2
(45) Date of Patent: Nov. 30, 2021

(54) HOLDING ARRANGEMENT FOR HOLDING A SUBSTRATE, CARRIER INCLUDING THE HOLDING ARRANGEMENT, PROCESSING SYSTEM EMPLOYING THE CARRIER, AND METHOD FOR RELEASING A SUBSTRATE FROM A HOLDING ARRANGEMENT

(71) Applicant: Applied Materials, Inc., Santa Clara, CA (US)

(72) Inventor: Simon Lau, Alzenau (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/766,335

(22) PCT Filed: Nov. 10, 2016

(86) PCT No.: PCT/EP2016/077325
§ 371 (c)(1),
(2) Date: Apr. 5, 2018

(87) PCT Pub. No.: WO2018/086698
PCT Pub. Date: May 17, 2018

(65) Prior Publication Data
US 2019/0256970 A1    Aug. 22, 2019

(51) Int. Cl.
*C23C 14/50* (2006.01)
*C23C 16/458* (2006.01)
(Continued)

(52) U.S. Cl.
CPC ............ *C23C 14/50* (2013.01); *C23C 16/458* (2013.01); *H01J 37/32715* (2013.01);
(Continued)

(58) Field of Classification Search
CPC ....... B25B 11/00; B25B 11/02; B25B 11/005; B23Q 3/06; B23Q 3/067; C23C 14/562;
(Continued)

(56) References Cited

U.S. PATENT DOCUMENTS

| | | | |
|---|---|---|---|
| 6,589,809 B1 | 7/2003 | Koopmans | |
| 7,875,144 B2 * | 1/2011 | Kobayashi | ........ H01L 21/67092 156/247 |
| 2005/0003635 A1 | 1/2005 | Takekoshi | |

FOREIGN PATENT DOCUMENTS

| | | |
|---|---|---|
| CN | 1885169 A | 12/2006 |
| CN | 101531215 A | 9/2009 |

(Continued)

OTHER PUBLICATIONS

Japanese Office Action dated Apr. 23, 2019 for Application No. 2018-521042.
(Continued)

*Primary Examiner* — Michael A Band
(74) *Attorney, Agent, or Firm* — Patterson + Sheridan LLP

(57) ABSTRACT

A holding arrangement for holding a substrate is described. The holding arrangement includes a body having a first wall of flexible material; an adhesive arrangement configured for attaching the substrate, wherein the adhesive arrangement is provided on a first side of the first wall, and a force transmission arrangement configured for applying a force to a second side of the first wall opposing the first side of the first wall.

11 Claims, 7 Drawing Sheets

(51) Int. Cl.
　　　*H01J 37/32* (2006.01)
　　　*H01L 21/67* (2006.01)
　　　*H01L 21/673* (2006.01)
　　　*H01L 21/687* (2006.01)
　　　*H01L 21/683* (2006.01)

(52) U.S. Cl.
　　　CPC .... *H01J 37/32816* (2013.01); *H01L 21/6734* (2013.01); *H01L 21/67092* (2013.01); *H01L 21/683* (2013.01); *H01L 21/6875* (2013.01); *H01L 21/68735* (2013.01)

(58) Field of Classification Search
　　　CPC ..... C23C 14/50; C23C 16/545; C23C 16/456; H01J 37/32715; H01J 37/32816; H01L 21/68; H01L 21/683; H01L 21/6875; H01L 21/68757; H01L 21/68735; H01L 21/67092; H01L 21/6734; H01L 21/67712
　　　See application file for complete search history.

(56) References Cited

FOREIGN PATENT DOCUMENTS

| | | | |
|---|---|---|---|
| JP | 201031193 A | | 2/2010 |
| JP | 2010031193 A | * | 2/2010 |
| JP | 2010209243 A | | 9/2010 |
| JP | 201289837 A | | 5/2012 |
| WO | 2012117509 A1 | | 9/2012 |
| WO | 20140109018 A1 | | 7/2014 |

OTHER PUBLICATIONS

Chinese Office Action dated Aug. 20, 2019 for Application No. 201680069177.4.

International Search Report and Written Opinion dated Jul. 31, 2017 for Application No. PCT/EP2016/077325.

CN Office Action dated Apr. 15, 2020 for Application No. 201680069177.4.

* cited by examiner

HOLDING ARRANGEMENT FOR HOLDING A SUBSTRATE, CARRIER INCLUDING THE HOLDING ARRANGEMENT, PROCESSING SYSTEM EMPLOYING THE CARRIER, AND METHOD FOR RELEASING A SUBSTRATE FROM A HOLDING ARRANGEMENT

TECHNICAL FIELD

Embodiments of the present disclosure relate to a holding arrangement for holding a substrate, a carrier for holding a substrate, a processing system for processing a substrate, and a method for releasing a substrate from a holding arrangement. Embodiments of the present disclosure particularly relate to a holding arrangement for holding a substrate during substrate processing in a vacuum processing chamber, a carrier for holding a substrate in a vacuum processing chamber, a vacuum processing system including a deposition source, and a method for releasing a substrate after substrate processing, particularly coating.

BACKGROUND

Techniques for layer deposition on a substrate include, for example, thermal evaporation, chemical vapor deposition (CVD) and physical vapor deposition (PVD) such as sputtering deposition. A sputter deposition process can be used to deposit a material layer on the substrate, such as a layer of an insulating material. During the sputter deposition process, a target having a target material to be deposited on the substrate is bombarded with ions generated in a plasma region to dislodge atoms of the target material from a surface of the target. The dislodged atoms can form the material layer on the substrate. In a reactive sputter deposition process, the dislodged atoms can react with a gas in the plasma region, for example, nitrogen or oxygen, to form an oxide, a nitride or an oxinitride of the target material on the substrate.

Coated materials can be used in several applications and in several technical fields. For instance, coated materials may be used in the field of microelectronics, such as for generating semiconductor devices. Also, substrates for displays can be coated using a PVD process. Further applications include insulating panels, organic light emitting diode (OLED) panels, substrates with thin film transistors (TFTs), color filters or the like.

The tendency toward larger and also thinner substrates can result in bulging of the substrates due to stress applied to the substrate, e.g., during a deposition process. In particular, conventional support systems which hold a substrate during a deposition process introduce bulging on the substrate, e.g., due to forces that push the substrate edge towards the center of the substrate. Bulging can, in turn, cause problems due to the increasing likelihood of breakage. Further, releasing a thin large area substrate from support systems, e.g. from substrate carriers, without bulging or damaging the substrate is challenging.

In light of the foregoing, there is a need to provide holding arrangements for holding a substrate, carriers for supporting a substrate, processing systems, and methods for releasing a substrate from a holding arrangement that overcome at least some of the problems in the art.

SUMMARY

In light of the above, a holding arrangement for holding a substrate, a carrier for holding a substrate, a processing system, and a method for releasing a substrate from a holding arrangement are provided. Further aspects, benefits, and features of the present disclosure are apparent from the claims, the description, and the accompanying drawings.

According to an aspect of the present disclosure, a holding arrangement for holding a substrate is provided. The holding arrangement includes a body having a first wall of flexible material; an adhesive arrangement configured for attaching the substrate, wherein the adhesive arrangement is provided on a first side of the first wall; and a force transmission arrangement configured for applying a force to a second side of the first wall opposing the first side of the first wall.

According to another aspect of the present disclosure, a carrier for holding a substrate is provided. The carrier includes a carrier body; and one or more holding arrangements according to any embodiments described herein, wherein the one or more holding arrangements are mounted on the carrier body.

According to yet another aspect of the present disclosure, a processing system is provided. The processing system includes a processing chamber; a processing device; and a carrier according to any embodiments described herein.

According to a further aspect of the present disclosure, a method for releasing a substrate from a holding arrangement is provided. The method includes providing a holding arrangement according to any embodiments described herein; and applying a force to the second side of the first wall such that a bending of the first wall of the body is provided.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Figure 1:
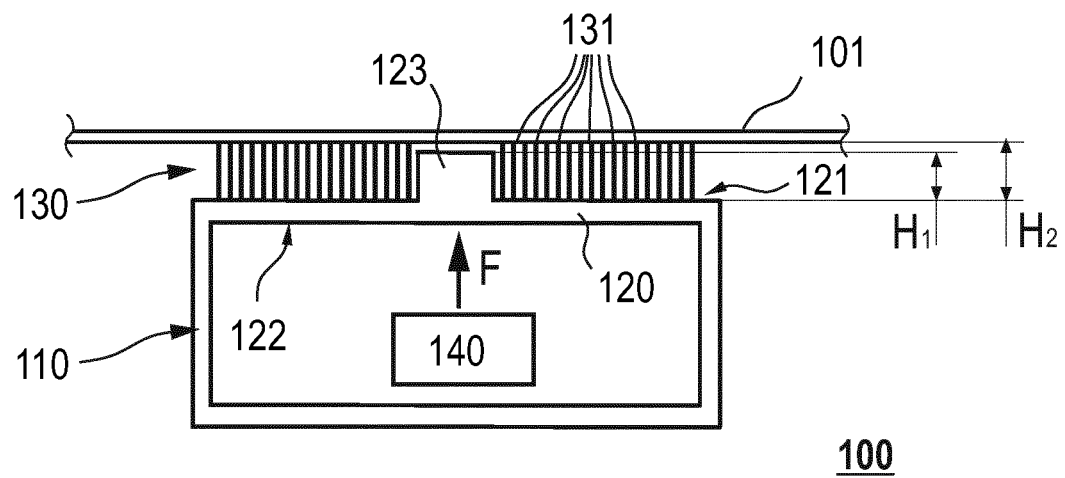
FIG. 1 shows a schematic cross-sectional side view of a holding arrangement according to embodiments described herein.

Reference will now be made in detail to the various embodiments, one or more examples of which are illustrated in each figure. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations.

Within the following description of the drawings, the same reference numbers refer to the same or to similar components. Generally, only the differences with respect to the individual embodiments are described. Unless specified otherwise, the description of a part or aspect in one embodiment applies to a corresponding part or aspect in another embodiment as well.

Before various embodiments of the present disclosure are described in more detail, some aspects with respect to some terms used herein are explained.

In the present disclosure, a "holding arrangement for holding a substrate" is to be understood as an arrangement configured for holding a substrate as described herein. In particular, the holding arrangement can be configured for holding a large area substrate in a vertical state. More particularly, a holding arrangement as described herein can be understood as an element of a carrier which is configured such that a substrate can be attached to the holding arrangement.

In the present disclosure, a "body having a first wall of flexible material" can be understood as a body which includes a wall which can elastically be deformed. For instance, the wall of flexible material can be made of silicone, a polymeric material, or particularly an elastomer. Alternatively, other flexible or elastic materials may be employed.

In the present disclosure, an "adhesive arrangement" is to be understood as an arrangement which is configured for providing an adhesive force for attaching a substrate as described herein. In particular, the adhesive arrangement can be provided on the holding arrangement, particularly on a body having a first wall of flexible material. More specifically, the adhesive arrangement as described herein may include a dry adhesive material. For instance, the dry adhesive material can be configured for providing the adhesive force by van der Waals forces as outlined herein.

In the present disclosure, a "force transmission arrangement" can be understood as an arrangement which is configured for exerting a force to a wall of flexible material as described herein, such that the wall can be deformed, particularly bended or bulged.

In the present disclosure, a "carrier for holding a substrate" is to be understood as a carrier which is configured for holding a substrate as described herein, particularly a large area substrate as described herein. Typically, the substrate held or supported by a carrier as described herein includes a front surface and a back surface, wherein the front surface is a surface of the substrate being processed, for example on which a material layer is to be deposited. Typically, the carrier is configured such that an edge portion of the back surface of the substrate can be attached to a holding arrangement, particularly to an adhesive arrangement of the holding arrangement as described herein.

The term "substrate" as used herein shall particularly encompass inflexible substrates, e.g., glass plates and metal plates. However, the present disclosure is not limited thereto and the term "substrate" can also encompass flexible substrates such as a web or a foil. According to some embodiments, the substrate can be made from any material suitable for material deposition. For instance, the substrate can be made from a material selected from the group consisting of glass (for instance soda-lime glass, borosilicate glass etc.), metal, polymer, ceramic, compound materials, carbon fiber materials, mica or any other material or combination of materials which can be coated by a deposition process. For example, the substrate can have a thickness of 0.1 mm to 1.8 mm, such as 0.7 mm, 0.5 mm or 0.3 mm. In some implementations, the thickness of the substrate may be 50 µm or more and/or 700 µm or less. Handling of thin substrates with a thickness of only a few microns, e.g. 8 µm or more and 50 µm or less, may be challenging.

According to some embodiments, the substrate can be a "large area substrate" and may be used for display manufacturing. For instance, the substrate may be a glass or plastic substrate. For example, substrates as described herein shall embrace substrates which are typically used for an LCD (Liquid Crystal Display), a PDP (Plasma Display Panel), and the like. For instance, a "large area substrate" can have a main surface with an area of 0.5 m$^2$ or larger, particularly of 1 m$^2$ or larger. In some embodiments, a large area substrate can be GEN 4.5, which corresponds to about 0.67 m$^2$ of substrate (0.73×0.92 m), GEN 5, which corresponds to about 1.4 m$^2$ of substrate (1.1 m×1.3 m), GEN 7.5, which corresponds to about 4.29 m$^2$ of substrate (1.95 m×2.2 m), GEN 8.5, which corresponds to about 5.7 m$^2$ of substrate (2.2 m×2.5 m), or even GEN 10, which corresponds to about 8.7 m$^2$ of substrate (2.85 m×3.05 m). Even larger generations such as GEN 11 and GEN 12 and corresponding substrate areas can similarly be implemented.

In the present disclosure, a "carrier body" is to be understood as a body of the carrier which is configured for holding the substrate. For instance, the carrier body can be a frame or a plate which is configured for holding a substrate as described herein. Accordingly, the carrier body as described herein can be configured to support a surface of the substrate, such as an edge portion of the back surface of the substrate.

FIG. 1 shows a schematic side view of a holding arrangement 100 according to embodiments described herein. The holding arrangement 100 for holding a substrate 101 includes a body 110 having a first wall 120 of flexible material, an adhesive arrangement 130 configured for attaching the substrate, wherein the adhesive arrangement 130 is provided on a first side 121 of the first wall 120, and a force transmission arrangement 140 configured for applying a force F to a second side 122 of the first wall 120 opposing the first side 121 of the first wall 120.

Accordingly, beneficially a holding arrangement for a substrate can be provided which is capable of conducting a method for releasing the substrate from the holding arrangement as described herein. In particular, the holding arrangement is configured such that by applying a force to the second side of the first wall, a deformation, particularly bending or bulging, of the first wall can be achieved. This beneficially results in a deformation, particularly bending or bulging, of the adhesive arrangement provided on the first side of the first wall, such that the adhesive arrangement can be detached from a substrate attached to the adhesive arrangement. In particular, the holding arrangement is configured such that for releasing the substrate from the holding arrangement, a relative movement of the adhesive arrangement with respect to the surface of the substrate can be provided. More specifically, the holding arrangement as described herein is configured such that shear forces at the interface between the adhesive arrangement and the substrate attached thereto can be induced, for instance by deforming, particularly bending or bulging of a wall on which the adhesive arrangement is provided.

With exemplary reference to FIG. 1, according to embodiments, which can be combined with any other embodiments described herein, the first wall 120 can include a protrusion 123 extending away from the first side 121 of the first wall 120. In particular, as exemplarily shown in FIG. 1, the protrusion may have a height $H_1$ which is smaller than the height $H_2$ of the adhesive arrangement 130 provided on the first side 121 of the first wall 120. Accordingly, it is to be understood that in an attachment mode of the holding arrangement as exemplarily shown in FIG. 1, the adhesive arrangement 130 is in contact with the substrate 101 and a small gap is provided between the protrusion 123 and the substrate 101. During detaching the substrate 101 from the adhesive arrangement 130, particularly by bending or bulging the first wall 120 as described herein, beneficially the protrusion 123 pushes the substrate away from the adhesive arrangement, as exemplarily shown in FIGS. 3B, 4B, and 6B.

Accordingly, providing the holding arrangement with a protrusion as described herein can be in particular be beneficial for inducing shear forces at the interface between the adhesive arrangement and the substrate attached thereto. In this regard, it is to be noted that releasing the substrate from the holding arrangement by inducing shear forces at the interface between the adhesive arrangement and the substrate can be the best and fastest way to detach the substrate from the holding arrangement.

Figure 2:
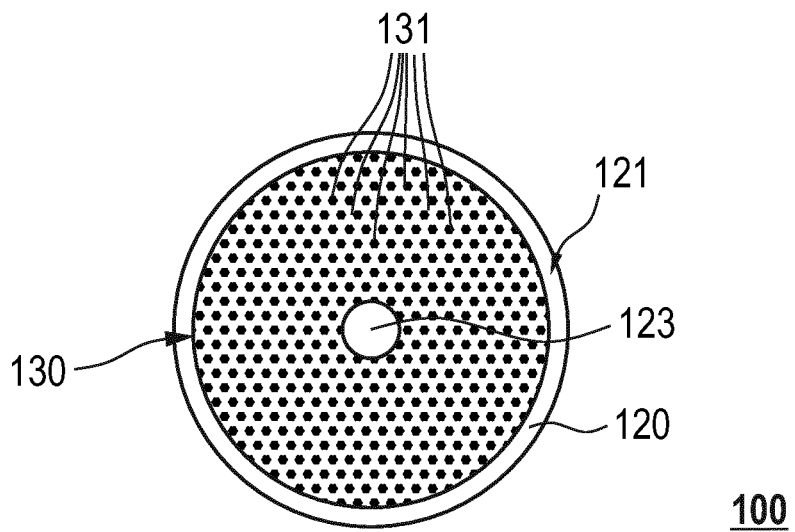
FIG. 2 shows a schematic top view of a holding arrangement according to embodiments described herein.

As exemplarily shown in FIGS. 1 and 2, according to embodiments, which can be combined with any other embodiments described herein, the adhesive arrangement 130 can include a plurality of filaments 131 (for illustration purpose only some filaments are marked by the reference sign). For instance, the filaments can be or include nanotubes, for instance carbon nanotubes. Additionally or alternatively, the plurality of filaments 131 can be made of or include a polymeric material, particularly a synthetic polymeric material. Each of the plurality filaments can be a substantially longitudinal member. Specifically, each of the plurality filaments can have one dimension that is larger than the remaining two dimensions. In particular, the longest dimension of the filaments can be the length of the filament. That is, the filaments can be elongated along a length direction.

As exemplarily shown in FIG. 1, each filament of the plurality of filaments 131 can be attached with one end to the first side 121 of the first wall 120 of the of the body 110. In particular, each filament of the plurality of filaments 131 can extend away from the first side 121 of the first wall 120, for instance perpendicular to first side 121 of the first wall 120. Accordingly, each filament of the plurality of filaments 131 can have a second end that is free, for instance for an attachment of a substrate as described herein. In particular, the second end of each filament of the plurality of filaments 131 can be configured to be attachable to the substrate 101. Specifically, the second end of each filament can be configured to adhere to the substrate 101 by van der Waals forces as outlined herein.

Further, as exemplarily shown in FIG. 1, the filaments of the plurality of filaments 131 can have a length which corresponds to the height $H_2$ of the adhesive arrangement 130. Accordingly, it is to be understood that the length of the filaments of the plurality of filaments can be larger than the height $H_1$ of the protrusion 123. Thus, during detaching the substrate from the adhesive arrangement 130, particularly by bending or bulging the first wall 120 as described herein, the protrusion 123 can push the substrate away from the plurality of filaments such that shear forces are induced at the contact points of the plurality of filaments with the substrate. This can particularly be beneficial for reducing the risk of damaging the substrate during releasing the substrate from the carrier, particularly from the holding arrangement of the carrier as described herein.

According to embodiments, which can be combined with any other embodiments described herein, the adhesive arrangement 130 can include a dry adhesive material configured for attaching the substrate 101. For instance, the dry adhesive material can be a synthetic setae material. The adhesive capabilities of the dry adhesive material, specifically of the synthetic setae material, can be related to the adhesive properties of a gecko foot. The natural adhesive capability of the gecko foot allows the animal to adhere to many types of surfaces under most conditions. The adhesive capability of the gecko foot is provided by numerous hair-type extensions, called setae, on the feet of the gecko. It is noted here that the term "synthetic setae material" can be understood as a synthetic material which emulates the natural adhesive capability of the gecko foot and which includes similar adhesive capabilities to the gecko foot. Moreover, the term "synthetic setae material" can be synonymously used with the term "synthetic gecko setae material" or with the term "gecko tape material". However, the present disclosure is not limited thereto and other dry adhesive materials suitable for holding the substrate can be used.

According to embodiments, which can be combined with any other embodiments described herein, the dry adhesive material, for example the synthetic setae material, can be inorganic. According to some embodiments described herein, the dry adhesive material can be substantially 100% inorganic. Moreover, the microstructure of the dry adhesive material can include nanotubes. According to some embodiments described herein, the microstructure of the dry adhesive material includes carbon nanotubes.

According to embodiments, which can be combined with any other embodiments described herein, the dry adhesive material can be a gecko adhesive. For example, the gecko adhesive may be a gecko tape or a gecko element.

In the context of the present disclosure, a "gecko adhesive" can be understood as an adhesive that mimics the ability of geckos' feet to adhere to surfaces, such as for example vertical surfaces. In particular, the dry adhesive material of the adhesive arrangement 130 as described herein can be configured to adhere to the substrate 101 due to van der Waals forces between the dry adhesive material and a surface of the substrate 101. However, the present disclosure is not limited thereto and other adhesives suitable for holding the substrate can be used.

According to embodiments, which can be combined with any other embodiments described herein, the adhesive force provided by the dry adhesive material can be sufficient for holding a substrate as described herein. In particular, the dry adhesive material can be configured to provide an adhesive force of about 2 N/cm$^2$ or more, particularly 3 N/cm$^2$ or more, more particularly 4 N/cm$^2$ or more, for instance at least 5 N/cm$^2$.

With exemplary reference to FIGS. 1 and 2, according to embodiments, which can be combined with any other embodiments described herein, the adhesive arrangement 130 can be provided around the protrusion 123. In particular, as shown in the schematic top view of the holding arrangement in FIG. 2, the plurality of filaments 131 may be provided around the protrusion 123 extending from the first side 121 of the first wall 120.

Figure 3A:
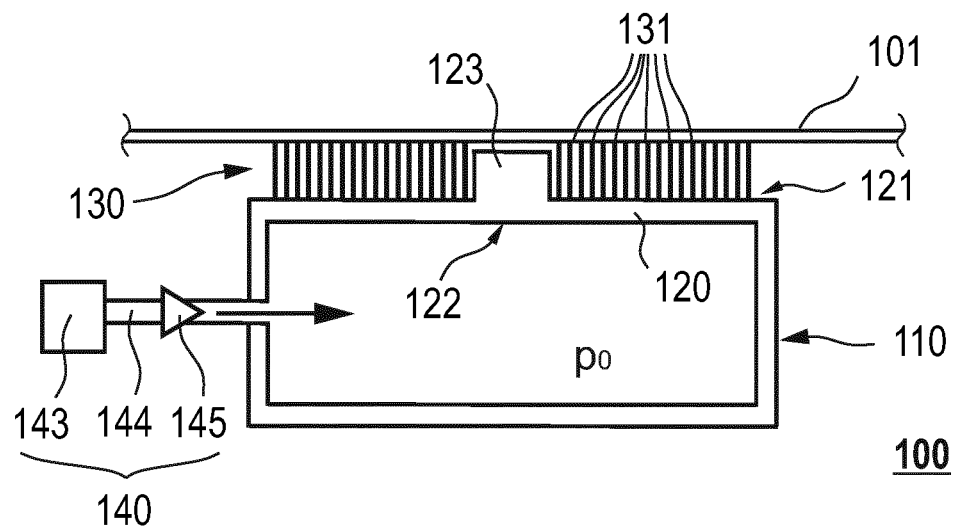
FIG. 3A shows a schematic cross-sectional side view of a holding arrangement in a first state according to embodiments described herein.
Figure 3B:
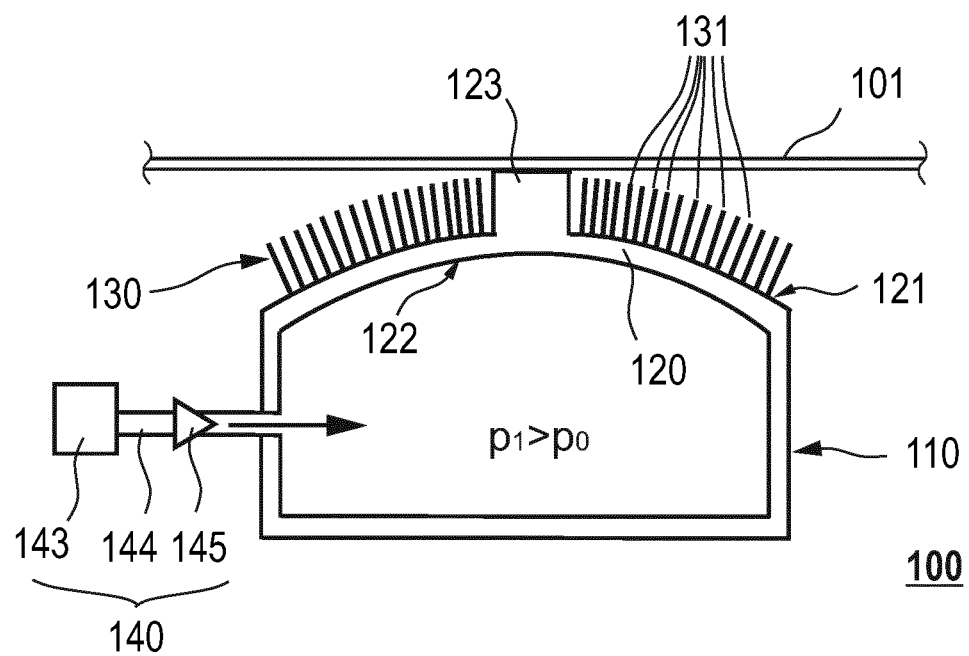
FIG. 3B shows a schematic cross-sectional side view of the holding arrangement of FIG. 3A in a second state.

With exemplary reference to FIGS. 3A and 3B, according to embodiments, which can be combined with any other embodiments described herein, the force transmission arrangement 140 can be a pneumatic actuated force transmission arrangement configured for increasing a pressure of a gas provided in the body 110. For instance the body 110 having a first wall 120 of flexible material can be a hollow body. More specifically, as exemplarily shown in FIGS. 3A and 3B, the pneumatic actuated force transmission arrangement may include a conduit 144 configured for providing a gas, for instance compressed dry air CDA, into the interior of the hollow body. Further, the pneumatic actuated force transmission arrangement may include a valve 145 and a pump 143 in order to increase a pressure inside the hollow body, such that the first wall 120 can be deformed, particularly bended or bulged. For illustration purpose, FIGS. 3A and 3B show a holding arrangement in two different states namely in an attachment state (FIG. 3A) and in a state during releasing (FIG. 3B) the substrate from the holding arrangement as described herein. In particular, FIG. 3A shows a schematic side view of a holding arrangement in a first state, e.g. in an attachment mode when a substrate 101 is attached to the adhesive arrangement 130 and the pressure inside the hollow body corresponds to approximately the ambient pressure $p_0$ such that the first wall is substantially flat. FIG. 3B shows a schematic side view of the holding arrangement of FIG. 3A in a second state during releasing the substrate from the holding arrangement, e.g. when the pressure inside the hollow body is increased to provide a pressure $p_1$ which is larger than the ambient pressure $p_0$ such that the first wall is bended or bulged.

Figure 4A:
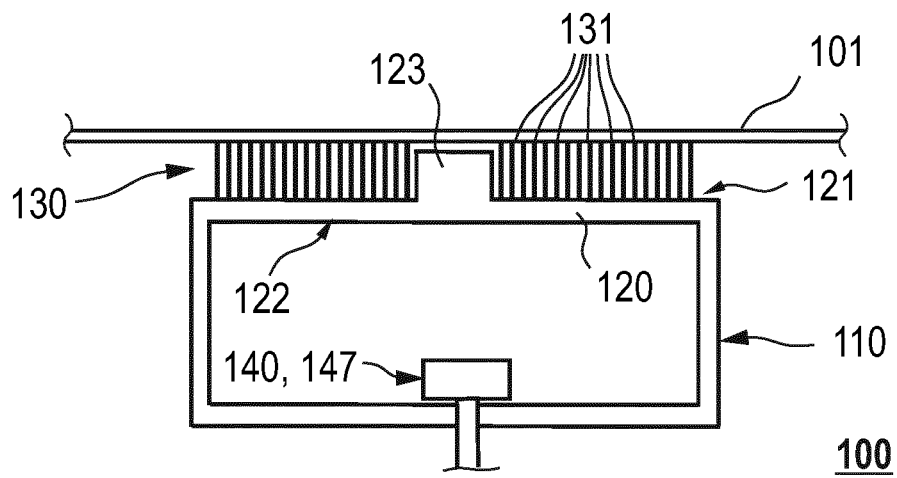
FIG. 4A shows a schematic cross-sectional side view of a holding arrangement in a first state according to further embodiments described herein.
Figure 4B:
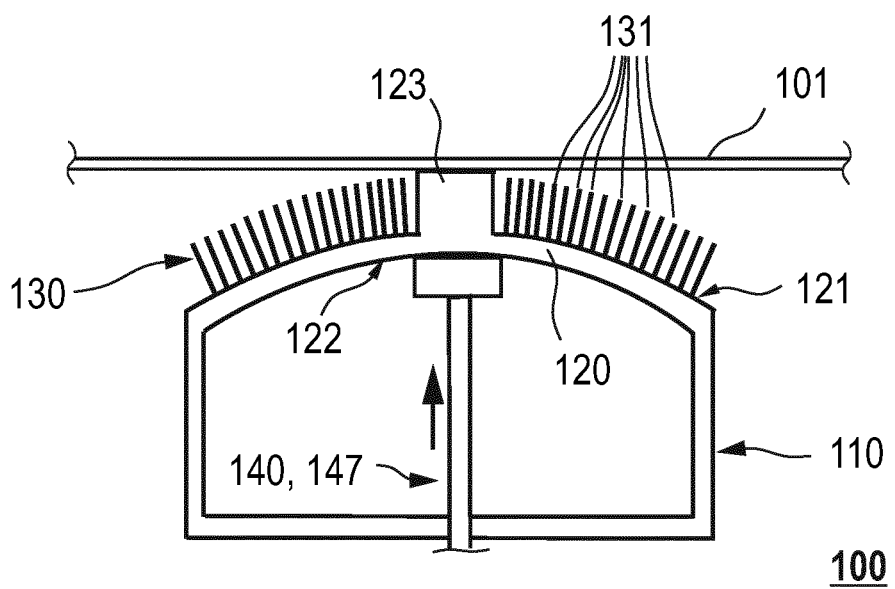
FIG. 4B shows a schematic cross-sectional side view of the holding arrangement of FIG. 4A in a second state.

With exemplary reference to FIGS. 4A and 4B, according to further embodiments, which can be combined with other embodiments described herein, the force transmission arrangement 140 can be a mechanically actuated force transmission arrangement configured for applying a bending force to the first wall 120 of the body 110. In particular, the mechanically actuated force transmission arrangement may include a piston 147 configured for pushing against the second side 122 of the first wall 120 such that a bending of the first wall 120 of the body 110 is provided. In other words, the mechanically actuated force transmission arrangement can be configured such that the base of the adhesive arrangement, i.e. the first wall 120 of the body 110, can be lifted such that the first wall bends or bulges. For illustration purpose, FIGS. 4A and 4B show a holding arrangement in two different states namely in an attachment state in which the first wall is substantially flat (FIG. 4A) and in a state during releasing (FIG. 4B) the substrate from the holding arrangement as described herein, i.e. a state in which the first wall is bended or bulged.

Figure 5:
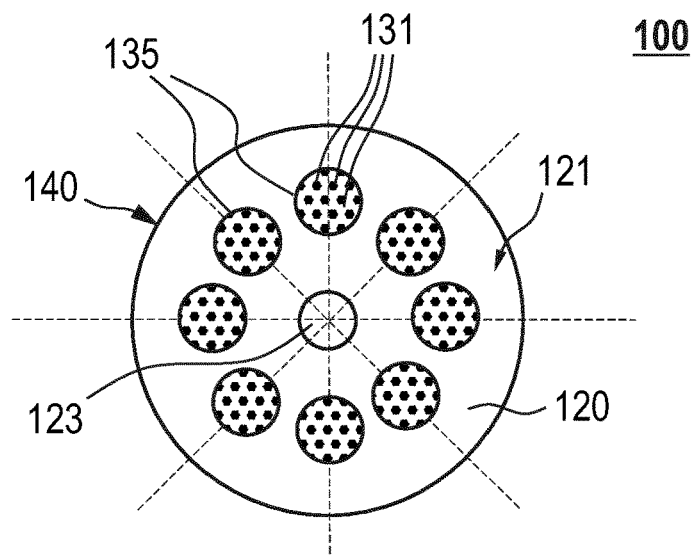
FIG. 5 shows a schematic top view of a holding arrangement according to further embodiments described herein.

With exemplary reference to FIG. 5, according to embodiments, which can be combined with any other embodiments described herein, the adhesive arrangement 130 can include two or more adhesive elements 135. In particular, the two or more adhesive elements 135 may be provided on the first side 121 of the first wall 120 of the body 110, as exemplarily shown in FIG. 5 as well as in FIGS. 6A and 6B. More specifically, each of the two or more adhesive elements 135 may include a solid base structure 136. Further, each of the two or more adhesive elements 135 may include an adhesive arrangement 130 as described herein. In particular, as exemplarily shown in FIGS. 6A and 6B, the adhesive arrangement 130 can be provided on a surface of the solid base structure 136 which faces a substrate 101 to be attached to the holding arrangement.

According to embodiments, which can be combined with any other embodiments described herein, the solid base structure 136 of the two or more adhesive elements 135 and the plurality of filaments 131 can include or consist of the same material. In particular, the solid base structure 136 of the two or more adhesive elements 135 and the plurality of filaments 131 may be made of a high temperature polymer. For instance, the high temperature polymer may have a temperature resistance of at least 150° C., particularly of at least 200° C., more particularly of at least 250° C. Accordingly, the two or more adhesive elements 135 may be configured to be resistant to a continuous service temperature of at least 150° C., particularly of at least 200° C., more particularly of at least 250° C. For instance, the high temperature polymer can have a temperature resistance of up to 300° C. For example, the solid base structure 136 of the two or more adhesive elements 135 and the plurality of filaments 131 may be made of at least one material selected from the group consisting of polyimide (PI), polyaryletherketone (PAEK), polyphenylensulfide (PPS), polyarylsulfone (PAS) and fluoropolymers (PTFE).

Embodiments of the holding arrangement having two or more adhesive elements as described herein may in particular be beneficial for high temperature applications in which the material of the body 110 of the holding arrangement 100 and/or the material of the solid base structure 136 of the two or more adhesive elements 135 and/or the material of the plurality of filaments 131 is typically a polymeric material which is stiffer compared to a polymeric material employed for low-temperature or medium temperature applications. In particular, the material of the body 110 of the holding arrangement 100 and/or the material of the solid base structure 136 of the two or more adhesive elements 135 and/or the material of the plurality of filaments 131 can be made of a high temperature polymer having a temperature resistance of at least 150° C., particularly of at least 200° C., more particularly of at least 250° C. For instance, the high temperature polymer can have a temperature resistance of up to 300° C.

According to embodiments, which can be combined with any other embodiments described herein, the material of the body 110 of the holding arrangement 100 and/or the material of the solid base structure 136 of the two or more adhesive elements 135 and/or the material of the plurality of filaments 131 can be at least one material selected from the group consisting of polyimide (PI), polyaryletherketone (PAEK), polyphenylensulfide (PPS), polyarylsulfone (PAS) and fluoropolymers (PTFE).

Figure 6A:
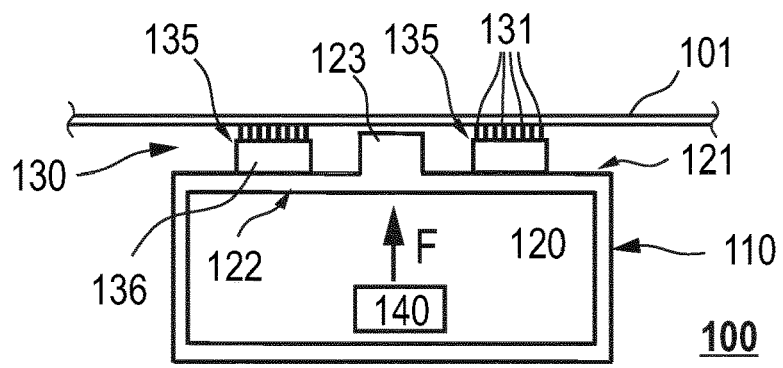
FIG. 6A shows a schematic cross-sectional side view of a first state of the holding arrangement shown in FIG. 5.
Figure 6B:
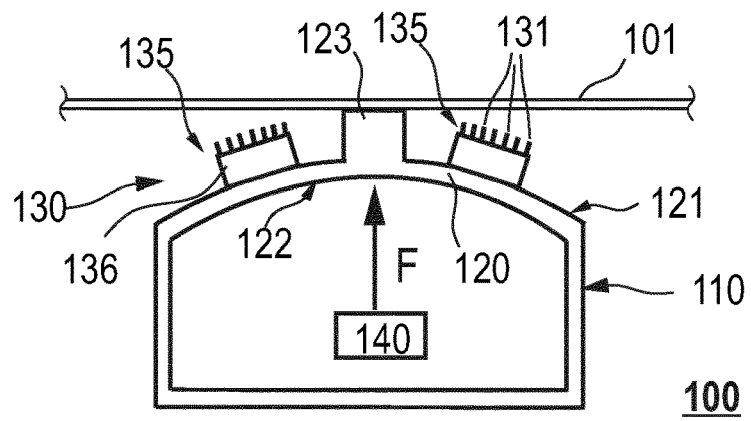
FIG. 6B shows a schematic cross-sectional side view of a second state of the holding arrangement shown in FIG. 6A.

For illustration purposes, FIGS. 6A and 6B show a holding arrangement having two or more adhesive elements in two different states, namely in an attachment state (FIG. 6A) and in a state during releasing (FIG. 6B) the substrate from the holding arrangement as described herein. In this regard it is noted that the technical principle of releasing the substrate from the holding arrangement for the embodiments shown in FIGS. 5, 6A and 6B is similar to the technical principle of releasing the substrate from the holding arrangement for the embodiments shown FIGS. 3A and 3B as well as in FIGS. 4A and 4B.

Figure 7:
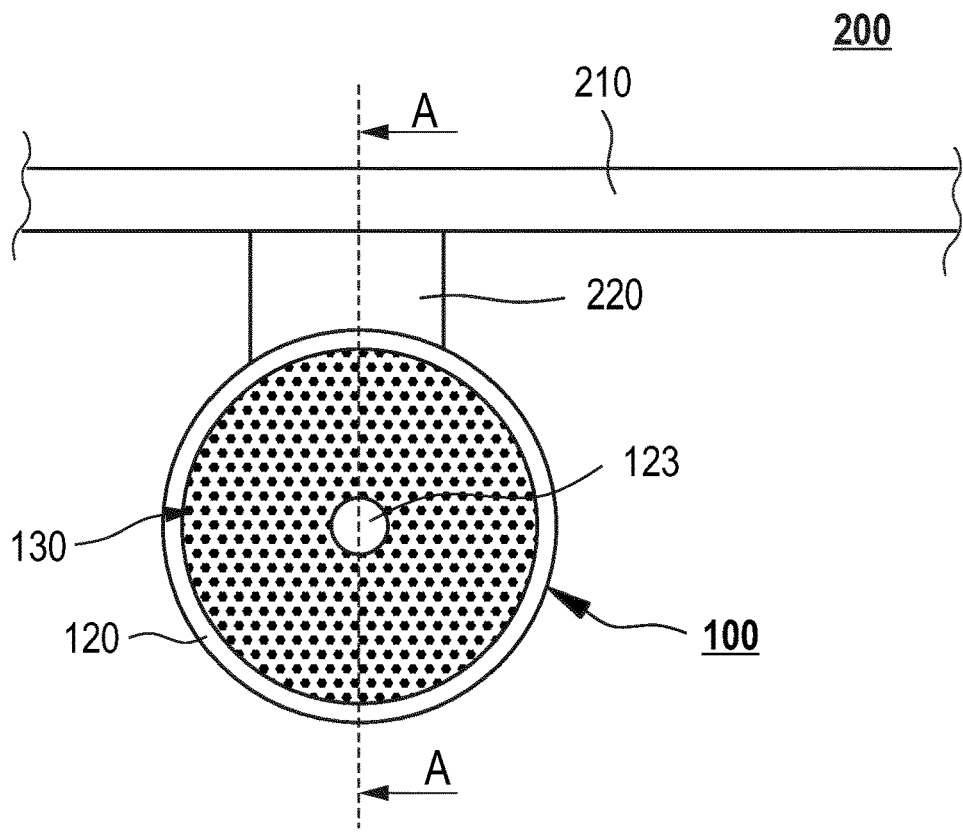
FIG. 7 shows a schematic top view of a section of carrier for holding a substrate according to embodiments described herein.
Figure 8:
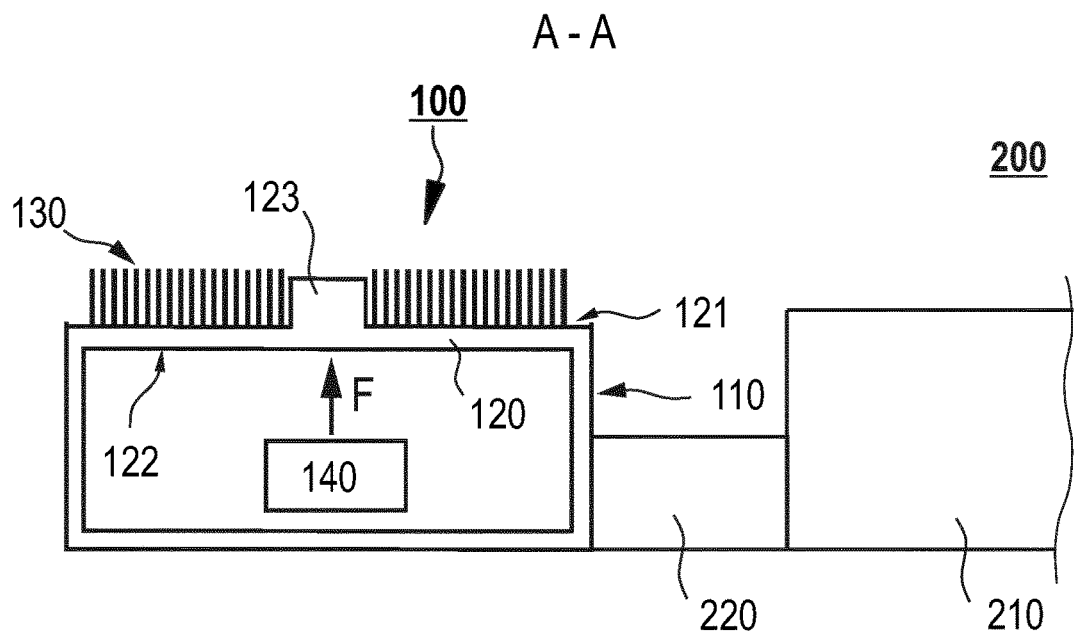
FIG. 8 shows a schematic cross-sectional view along the line A-A of the section of the carrier shown in FIG. 7.

With exemplary reference to FIGS. 7, 8 and 9A to 9C exemplary embodiments of a carrier according to the present disclosure are described. In particular, FIG. 7 shows a schematic top view of a section of carrier for holding a substrate according to embodiments described herein and FIG. 8 shows a schematic cross-sectional view along the line A-A of the section of the carrier shown in FIG. 7.

According to embodiments, which can be combined with any other embodiments described herein, the carrier 200 includes a carrier body 210 and one or more holding arrangements. In particular, the one or more holding arrangements can be holding arrangements 100 according to embodiments described herein. Typically, the one or more holding arrangements 100 are mounted on the carrier body 210. For instance, each of the one or more holding arrangements 100 can be connected to a support structure 220. The support structure 220 can be connected to the carrier body 210. Accordingly, the carrier 200 having one or more holding arrangements 100 as described herein, is configured for holding a substrate, particularly a substrate as described herein. Typically, the one or more holding arrangements 100 are configured to provide a holding force for holding the substrate. For instance, the holding force can be substantially parallel to a surface of the substrate, in particular when the substrate is in a substantially vertical orientation. For instance, the holding force can be provided by the adhesive arrangement 130 of the holding arrangement 100 as described herein.

According to embodiments, which can be combined with any other embodiments described herein, the carrier 200 is configured to support the substrate during substrate processing, for example, during a layer deposition process, such as a sputtering process. With exemplary reference to FIGS. 9A to 9C, the carrier body 210 may be configured as a frame. Alternatively, the carrier body 210 may be configured as a plate. According to some embodiments, the carrier body 210 can include and/or be made of aluminum, aluminum alloys, titanium, titanium alloys, stainless steel or the like. According to some embodiments, which can be combined with other embodiments described herein, the carrier body 210 can include two or more elements such as a top bar, sidebars and a bottom bar. The two or more elements can define an aperture opening 215, as exemplarily shown in FIG. 9C. In some implementations, a masking device can be provided at the carrier to mask one or more portions of the substrate. As an example, the masking device can be an edge exclusion mask.

Figure 9A:
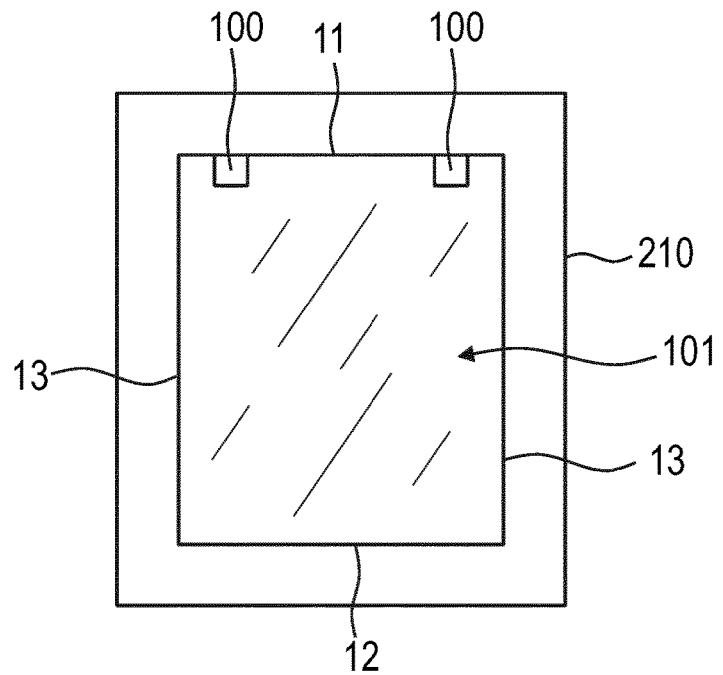
FIGS. 9A and 9B show schematic front views of embodiments of a carrier described herein.
Figure 9B:
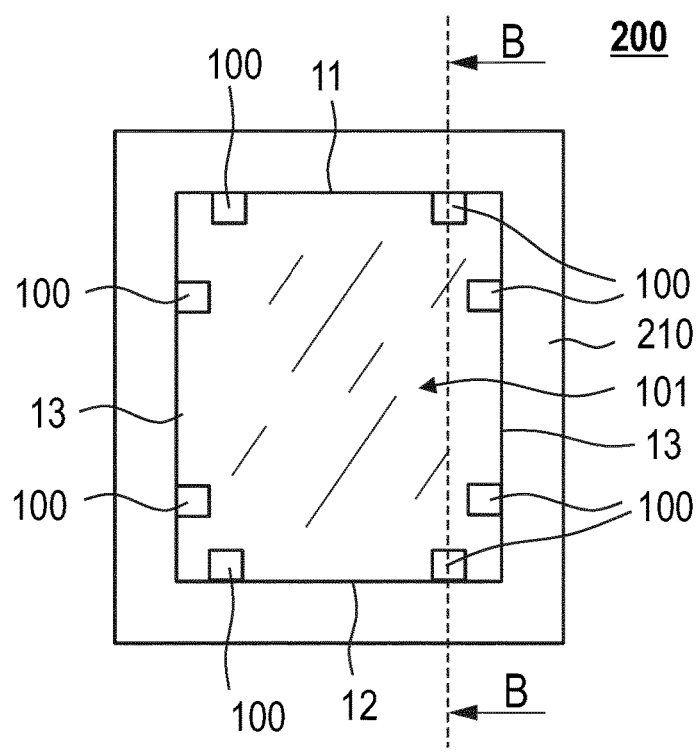
Figure 9C:
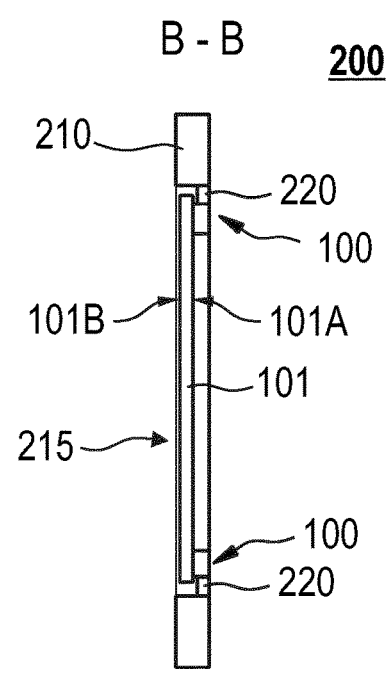
FIG. 9C shows a schematic sectional view along the line B-B of the carrier shown in FIG. 9B.

As exemplarily shown in FIG. 9C, typically the substrate 101 can have a first surface 101A and a second surface 101B. The first surface and the second surface can be opposite surfaces of the substrate 101. In particular, the first surface can be a backside surface of the substrate 101. As an example, the first surface 101A can be arranged to face towards the one or more holding arrangements 100 of the carrier 200.

Accordingly, as exemplarily shown in FIG. 9C, according to some embodiments, which can be combined with other embodiments described herein, the adhesive arrangement 130 of the one or more holding arrangements 100 of the carrier 200 can be configured to contact the first surface 101A of the substrate 101. Further, as exemplarily shown in FIG. 9C, the second surface 101B can be a front surface of the substrate 101. In particular, the second surface can be a surface of the substrate to be processed in a processing system, particularly in a vacuum processing chamber of a processing system as described herein. As an example, the second surface of the substrate can be configured for layer deposition thereon.

With exemplarily reference to FIGS. 9A to 9C, according to embodiments which can be combined with other embodiments described herein, the carrier 200 can be configured for holding or supporting the substrate 101 in a substantially vertical orientation, e.g., during a layer deposition process. As an example, the one or more holding arrangements 100 can be configured to hold the substrate 101 in the substantially vertical orientation. As used throughout the present disclosure, "substantially vertical" can be understood particularly when referring to the substrate orientation, to allow for a deviation from the vertical direction or orientation of ±20° or below, e.g. of ±10° or below. This deviation can be provided for example because a substrate support with some deviation from the vertical orientation might result in a more stable substrate position. Yet, the substrate orientation, e.g., during the layer deposition process, can be considered substantially vertical, which can be considered different from the horizontal substrate orientation.

As exemplarily shown in FIGS. 9A and 9B, the substrate 101 can have an upper side 11, a lower side 12 and two lateral sides 13 (e.g., a left side and a right side). The upper side 11, the lower side 12 and the two lateral sides 13 can be defined with respect to a vertical orientation of the substrate 101. Likewise, the carrier 200 or carrier body 210 can have an upper side, a lower side and two lateral sides (e.g., a left side and a right side).

In some implementations, the one or more holding arrangements 100 can be mounted on the carrier body 210 to hold at least one of the upper side 11, the lower side 12, and at least one of the two lateral sides 13 of the substrate 101. For instance, as exemplarily shown in FIG. 9A, one or more holding arrangements 100 (e.g., two holding arrangements) can be provided to hold the upper side 11. According to another implementation, one or more holding arrangements 100 (e.g., two holding arrangements) can be provided to hold the lower side 12 of the substrate and/or two or more holding arrangements 100 can be provided to hold each side of the two lateral sides 13 (e.g., two holding arrangements for the left side and two holding arrangements for the right side), as exemplarily shown in FIG. 9B.

According to some embodiments described herein, the one or more holding arrangements 100 can be mounted on the carrier body 210 to hold the substrate 101 in a suspended state. Specifically, the one or more holding arrangements 100 can be configured to hold the upper side 11 of the substrate 101. For instance, in some implementations as exemplarily shown in FIG. 9A, the substrate 101 is only held at the upper side 11. Accordingly, the carrier 200 may include one or more holding arrangements 100 (e.g., two holding arrangements) only at the upper side of the carrier body 210 to hold the upper side 11 of the substrate 101.

With exemplary reference to FIG. 9C, according to some embodiments, which can be combined with other embodiments described herein, the holding arrangement 100 can be configured to contact the substrate 101 only on one surface of the substrate 101, particularly the backside of the substrate, i.e. the surface of the substrate 101 that is not processed. Further, the support structure 220 can be provided between each of the one or more holding arrangements 100 and the carrier body 210. As exemplarily shown in FIG. 9C, the aperture opening 215 can correspond to or be larger, specifically slightly larger, than a surface area of the substrate 101 to be processed. Accordingly, embodiments of the carrier as described herein are configured such that the whole front side of the substrate can be processed. Specifically, some embodiments described herein can be practiced without devices providing edge exclusion. According to other embodiments (not explicitly shown), the aperture opening 215 can be a slightly smaller than a surface area of the substrate to be processed. Accordingly, the aperture opening 215 can be configured such that an unprocessed edge of the substrate, particularly an uncoated edge of the substrate, can be provided.

It is to be understood that a carrier according to embodiments described herein can be employed for stationary processes as well as for non-stationary processes.

Figure 10:
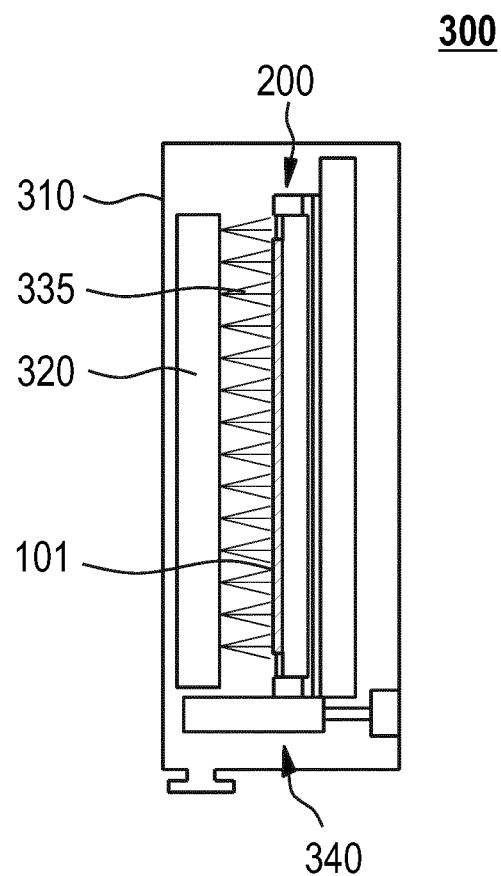
FIG. 10 shows a schematic view of a processing system according to embodiments described herein.

With exemplary reference to FIG. 10, a processing system 300 according to embodiments of the present disclosure are described. The processing system includes a processing chamber 310, a processing device 320, and a carrier 200 according to any embodiments described herein. In particular, the processing chamber 310 may be a vacuum processing chamber, such as a deposition chamber adapted for a vacuum deposition process. For instance, the deposition process can be a PVD or CVD process. Typically, the carrier 200 with the substrate 101 positioned thereon is provided in processing chamber 310 for substrate processing. In particular, the carrier 200 can be configured according to embodiments described herein and can have one or more holding arrangements 100 as described herein. Further, as exemplarily shown in FIG. 10, the processing system 300 may include a transportation device 340 configured for transporting a carrier 200 according to embodiments described herein.

According to embodiments, which can be combined with other embodiments described herein, the processing device 320 may be a material deposition source which can be provided in the processing chamber 310 facing the side of the substrate 101 to be processed, e.g. coated. As exemplarily indicated in FIG. 10, the material deposition source can provide deposition material 335 to be deposited on the substrate 101. For instance, the deposition material source can be a target with deposition material thereon or any other arrangement allowing material to be released for deposition on the substrate. In some implementations, the material deposition source can be a rotatable target. According to some embodiments described herein, the material deposition source can be movable in order to position and/or replace the material deposition source. According to other embodiments described herein, the deposition material source can be a planar target.

According to some embodiments described herein, which can be combined with other embodiments described herein, the deposition material 335 can be chosen according to the deposition process and the later application of the coated substrate. For instance, the deposition material 335 of the material deposition source can be a material selected from the group consisting of: a metal, such as aluminum, molybdenum, titanium, copper, or the like, silicon, indium tin oxide, and other transparent conductive oxides. Oxide-, nitride- or carbide-layers, which can include such materials, can be deposited by providing the material from the material deposition source or by reactive deposition, i.e. the material from the material deposition source can react with elements like oxygen, nitride, or carbon from a processing gas.

Figure 11:
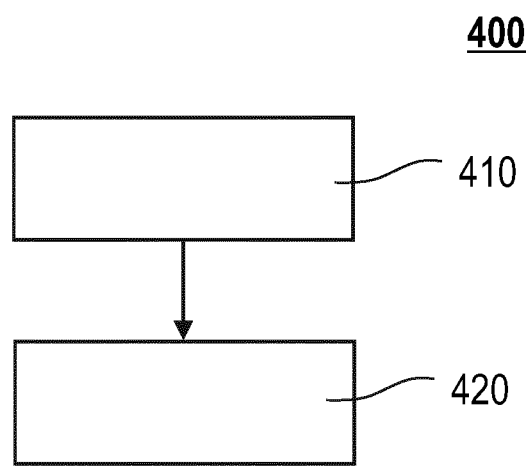
FIG. 11 shows a flow chart illustrating a method for releasing a substrate from a holding arrangement according to embodiments described herein.

With exemplary reference to FIG. 11, embodiments of a method for releasing a substrate from a holding arrangement according to the present disclosure are described. Typically, the method 400 for releasing a substrate from a holding arrangement, includes providing 410 a holding arrangement 100 according to any embodiments described herein, and applying 420 a force to the second side 122 of the first wall 120 such that a bending or bulging of the first wall 120 of the body 110 is provided which results in a release of the substrate from the holding arrangement. In particular, by bending or bulging of the first wall 120 of the body 110 the protrusion of the holding arrangement may be pushed against the backside surface of the substrate such that the adhesive arrangement can be released from the backside surface of the substrate.

Accordingly, an improved method for releasing a substrate, particularly a large area substrate, from a carrier is provided. More specifically, the method as described provides for inducing shear forces at the interface between an adhesive arrangement of the holding arrangement and the substrate attached thereto, such that the risk of damaging the substrate during releasing the substrate from the carrier can be reduced.

According to embodiments, which can be combined with any other embodiments described herein, applying 420 a force to the second side 122 of the first wall 120 comprises employing a pneumatic actuated force transmission arrangement configured for increasing a pressure of a gas provided in the body 110 of the holding arrangement, the body 110 being a hollow body. In particular, the pneumatic actuated force transmission arrangement can be configured as described herein.

According to embodiments, which can be combined with any other embodiments described herein, applying 420 a force to the second side 122 of the first wall 120 comprises employing a mechanically actuated force transmission arrangement configured for applying a bending force to the first wall 120 of the body 110. In particular, the mechanically actuated force transmission arrangement can be configured as described herein.

According to embodiments described herein, the method for releasing a substrate from a holding arrangement can be conducted by means of computer programs, software, computer software products and interrelated controllers, which can have a CPU, a memory, a user interface, and input and output devices being in communication with the corresponding components of an apparatus for processing a substrate, such as the processing system described herein.

While the foregoing is directed to embodiments of the disclosure, other and further embodiments of the disclosure may be devised without departing from the basic scope thereof, and the scope thereof is determined by the claims that follow.

In particular, this written description uses examples to disclose the disclosure, including the best mode, and also to enable any person skilled in the art to practice the described subject-matter, including making and using any devices or systems and performing any incorporated methods. While various specific embodiments have been disclosed in the foregoing, mutually non-exclusive features of the embodiments described above may be combined with each other.

The patentable scope is defined by the claims, and other examples are intended to be within the scope of the claims if the claims have structural elements that do not differ from the literal language of the claims, or if the claims include equivalent structural elements with insubstantial differences from the literal language of the claims.

The invention claimed is:

1. A method for releasing a substrate from a holding arrangement in a vacuum processing chamber, comprising:
   providing the holding arrangement for holding the substrate, the holding arrangement comprising:
   a body having a first wall of flexible material;
   an adhesive arrangement configured for attaching the substrate, wherein the adhesive arrangement is provided on a first side of the first wall, the adhesive arrangement comprising a plurality of adhesive elements having a solid base structure and arranged in a circular pattern around a protrusion extending away from the first side of the first wall, and in a direction facing the substrate; and
   a force transmission arrangement configured for applying a force to a second side of the first wall opposing the first side of the first wall, and wherein the adhesive arrangement includes a plurality of filaments positioned on the adhesive elements, wherein the adhesive elements and the plurality of filaments comprise the same material; and
   applying the force to the second side of the first wall such that a bending of the first wall of the body is provided, wherein the bending of the first wall of the body causes the protrusion to push the substrate away from the adhesive arrangement.

2. The method according to claim 1, wherein applying the force to the second side of the first wall comprises employing the force transmission arrangement, the force transmission arrangement being pneumatically actuated and configured for increasing a pressure of a gas provided in the body of the holding arrangement, the body being a hollow body.

3. The method according to claim 1, wherein applying the force to the second side of the first wall comprises employing the force transmission arrangement, the force transmission arrangement being mechanically actuated and configured for applying the force to the first wall of the body.

4. The method according to claim 1, wherein the adhesive arrangement comprises a dry adhesive material configured for attaching the substrate.

5. The method according to claim 4, wherein the dry adhesive material is a synthetic setae material.

6. The method according to claim 3, wherein the mechanically actuated force transmission arrangement comprises a piston configured for pushing against the second side of the first wall such that the bending of the first wall of the body is provided.

7. The method according to claim 4, wherein the dry adhesive material is a gecko adhesive.

8. The method according to claim 1, wherein the protrusion has a height which is smaller than the height of the adhesive arrangement.

9. The method according to claim 1, wherein the plurality of filaments extend away from the first side of the first wall.

10. The method according to claim 1, wherein the plurality of filaments and the adhesive elements are made of polymer having a temperature resistance of at least 200° C.

11. The method according to claim 1, wherein the plurality of filaments and the adhesive elements are made of at least one material selected from the group consisting of polyimide (PI), polyaryletherketone (PAEK), polyphenylensulfide (PPS), polyarylsulfone (PAS), and fluoropolymers (PTFE).

* * * * *